United States Patent
Peiffer

(10) Patent No.: US 9,247,645 B2
(45) Date of Patent: Jan. 26, 2016

(54) DIELECTRIC MATERIAL WITH NON-HALOGENATED CURING AGENT

(75) Inventor: Joel S. Peiffer, Maplewood, MN (US)

(73) Assignee: 3M INNOVATIVE PROPERTIES COMPANY, St. Paul, MN (US)

(*) Notice: Subject to any disclaimer, the term of this patent is extended or adjusted under 35 U.S.C. 154(b) by 733 days.

(21) Appl. No.: 12/909,462

(22) Filed: Oct. 21, 2010

(65) Prior Publication Data

US 2011/0108309 A1    May 12, 2011

Related U.S. Application Data

(60) Provisional application No. 61/258,809, filed on Nov. 6, 2009.

(51) Int. Cl.
| | |
|---|---|
| C08L 63/00 | (2006.01) |
| C08K 3/22 | (2006.01) |
| C08K 3/36 | (2006.01) |
| C08K 3/10 | (2006.01) |
| H05K 1/03 | (2006.01) |
| H05K 1/09 | (2006.01) |
| H05K 1/16 | (2006.01) |
| H05K 9/00 | (2006.01) |
| B32B 5/02 | (2006.01) |

(52) U.S. Cl.
CPC *H05K 1/162* (2013.01); *C08K 3/10* (2013.01); *C08K 3/22* (2013.01); *C08K 3/36* (2013.01); *C08L 63/00* (2013.01); *C08K 2003/2206* (2013.01); *C08K 2003/2237* (2013.01); *H05K 2201/0209* (2013.01)

(58) Field of Classification Search
None
See application file for complete search history.

(56) References Cited

U.S. PATENT DOCUMENTS

| | | | |
|---|---|---|---|
| 4,180,607 A * | 12/1979 | Sasaki et al. | 528/112 |
| 4,684,678 A | 8/1987 | Schultz et al. | |
| 5,874,152 A | 2/1999 | Middelman | |
| 6,274,224 B1 | 8/2001 | O'Bryan et al. | |
| 6,577,492 B2 | 6/2003 | O'Bryan, Jr. | |
| 6,638,378 B2 | 10/2003 | O'3 Bryan et al. | |
| 6,905,757 B2 * | 6/2005 | Matsushima et al. | 428/209 |
| 7,417,111 B2 * | 8/2008 | Matayabas et al. | 528/403 |
| 7,531,112 B2 * | 5/2009 | Shin et al. | 252/500 |
| 7,672,113 B2 * | 3/2010 | Pramanik et al. | 361/321.4 |
| 7,723,407 B2 * | 5/2010 | Sugioka et al. | 523/443 |
| 2004/0029043 A1 * | 2/2004 | Wakizaka et al. | 430/280.1 |
| 2004/0166326 A1 * | 8/2004 | Akatsuka et al. | 428/413 |
| 2005/0029515 A1 | 2/2005 | Nagai | |

(Continued)

FOREIGN PATENT DOCUMENTS

| | | |
|---|---|---|
| CN | 101381506 A | 3/2009 |
| JP | 2003-105205 | 4/2003 |

(Continued)

OTHER PUBLICATIONS

Hyun et al., Frequency and Temperature Dependence of Dielectric Constant of Epoxy/BaTiO3 Composite Embedded Capacitor Films (ECFs) for Organic Substrate, 2005 Electronic Components and Technology Conference.*

(Continued)

*Primary Examiner* — Mark Kaucher
*Assistant Examiner* — Kregg Brooks
(74) *Attorney, Agent, or Firm* — Clifton F. Richardson

(57) ABSTRACT

Provided is a dielectric material having a non-halogenated diaminodiphenylsulfone curing agent.

20 Claims, 1 Drawing Sheet

(56) References Cited

U.S. PATENT DOCUMENTS

| | | |
|---|---|---|
| 2006/0182973 A1 | 8/2006 | Lee |
| 2007/0049485 A1 | 3/2007 | Tanabe |
| 2008/0032103 A1* | 2/2008 | Kikuchi et al. ............... 428/214 |
| 2010/0144947 A1* | 6/2010 | Narishige et al. ............. 524/435 |

FOREIGN PATENT DOCUMENTS

| | | |
|---|---|---|
| JP | 2004-319561 | 11/2004 |
| JP | 2005-116604 | 4/2005 |
| JP | 2007-123550 | 5/2007 |
| WO | WO 2007/002100 | 1/2007 |
| WO | WO 2008-146014 | 12/2008 |

OTHER PUBLICATIONS

Kim et al., Temperature and Frequency Dependence of Dielectric Properties of (Ba, Sr, Mg)TiO3 Ceramic Capacitors, J. Korean Phys. Soc. vol. 32, (Feb. 1998) pp. S289-291.*

Kang et al., "Effect of Dysprosium Oxide Addition on the Microstructure and Dielectric Properties of BaTiO3 Ceramics," Elec. Mat. Lett. 6:4, 145-149 (2010).*

Dang et al., "Study on Microstructure and Dielectric Property of the BaTiO3/Epoxy Resin Composites," Composites Sci. Tech. 68, 171-177 (2008).*

George Wypych, Handbook of Fillers (2010).*

Matweb Plastic Material Data Sheets (2013).*

Tchmyreva et al., "Structure and dielectric properties of polymeric composites with ferroelectric fillers," E-Polymers, No. 036 (2003).*

Pan et al., "Effect of Structure of Bridging Group on Curing and Properties of Bisphenol-A Based Novolac Epoxy Resins", Polymer Journal, vol. 39, No. 5, pp. 478-487 (2007).

Sharma et al., "Curing Kinetics and Thermal Stability of Diglycidyl Ether of Bisphenol", Journal of Thermal Analysis and Calorimetry, vol. 91 (2008) 1, pp. 231-236.

Singh et al., "Curing Kinetics and Thermal Stability of Diglycidyl Ether of Bisphenol-A Using Mixtures of Heterocyclic Derivatives of Stannanes and 4,4'-Diaminodiphenylsulfone", Chinese Journal of Chemistry, 2008, 26, pp. 445-452.

Su et al., "Thermal properties of rigid rod epoxies cured with diaminodiphenylsulfone and dicyandiamide", Thermochimica Acta 392-393 (2002) 391-394.

Wei et al., "Effects of liquid crystalline polyurethane on the structure and properties of epoxy", Journal of Materials Science Letters, 21, 2002, 719-722.

Zhang et al., "Curing Behavior of Epoxy/POSS/DDS Hybrid Systems", Polymer Composites, 2008, 77-83.

Zhang et al., "Thermodegradation Kinetics of Epoxy/DDS/POSS System", Polymer Composites, 2007, 755-761.

Zong et al., "Dielectric studies of three epoxy resin systems during microwave cure", Polymer 46 (2005) 2638-2645.

International Search Report, mailed Jul. 7, 2011.

Yu, Fenyan et al, "Preparation of $BaTiO_3$/Epoxy Resin Composite Materials and Study of the Dielectric Properties of the Materials", *Functional Materials* (May 16, 2007); vol. 38, No. 9; pp. 1478-1480.

Search Report for CN Appl. No. 201080050103.9, mailed on Apr. 8, 2014, 4 pp.

Yu, et al, "Preparation of Barium Titanate/Epoxy Resin Composite Materials and Study of the Dielectric Properties of Barium Titanate/Epoxy Resin Composite Materials", *Functional Materials* (May 16, 2007); vol. 38, No. 9; pp. 1478-1480.

* cited by examiner

DIELECTRIC MATERIAL WITH NON-HALOGENATED CURING AGENT

CROSS REFERENCE TO RELATED APPLICATION

This application claims the benefit of U.S. Provisional Patent Application No. 61/258,809, filed Nov. 6, 2009, the disclosure of which is incorporated by reference herein in its entirety.

TECHNICAL FIELD

This invention relates to an electrical article, methods for making the electrical article, and articles made therefrom.

BACKGROUND

A continuing trend in the electronics industry is the miniaturization of electronic circuits and a corresponding increase of the circuit element density of electronic circuits. On conventional printed circuit boards, a large fraction of the board surface area is occupied by surface-mounted passive electrical devices, such as resistors, capacitors and inductors. One way to increase the density of circuit elements in an electronic circuit is to remove passive devices from the surface of the circuit board, and embed or integrate the passive devices into the circuit board itself. This has the added advantage of placing the passive devices much closer to the active circuit components, thus reducing electrical lead length and lead inductance, improving circuit speed, and reducing signal noise. Signal noise and power bus noise can lead to signal integrity and electro-magnetic interference (EMI) issues. Embedding the passive components into the board can reduce the size, thickness and number of layers required in the board, which can significantly reduce the cost of the circuit board. The reduction in board size and thickness, as well as the elimination of the surface-mounted components and their associated vias and solder joints, can provide a significant reduction in weight and improved reliability.

Complex high speed digital and mixed signal systems are being used to accommodate the desire for increasing functionality in electronic products. These high speed digital systems require large quantities of power supply decoupling capacitors to effectively decouple the AC noise from the power supply. Additionally, signal rise times, frequencies and current and board densities continue to increase, as operating voltages and their associated noise margins decrease. Simultaneous switching noise (SSN) is increasing due to lower operating voltages and higher currents. These factors make power supply decoupling more challenging.

Even with the use of embedded passives, average printed circuit board layer counts are increasing, which is increasing overall board thickness. Increased board thicknesses and higher assembly temperatures, which are needed to accommodate regulatory-required lead-free assemblies, significantly increase thermal stresses and moisture vapor pressures on the board materials and components. Complex board designs must endure more assembly passes due to the increase in double sided surface mount components and increased rework due to higher component densities. To survive the increased number of assembly passes and harsh conditions, board materials must have good adhesion, high decomposition temperatures and high resistance to moisture sensitivity.

Additionally, recent regulatory requirements have specified the use of materials with less than 900 ppm of bromine and less than 900 ppm of chlorine in printed circuit boards, modules and chip packaging. Thus, embedded passive materials must not only have excellent electrical, mechanical, thermal properties and high reliability but are also limited by composition to not include more than trace amounts of halogens.

SUMMARY

Embodiments of the present invention include dielectric materials with high dielectric constants that meet electrical performance industry requirements and are compatible with high lead-free assembly temperatures, while also using non-halogenated components.

Dielectric materials of the present invention were found to have high relative capacitance and high dissipation factors at temperatures above about 115° C., which make the well-suited for use in power supply decoupling low pass filters, low and mid-frequency band pass filters, and band stop filters.

One embodiment of the present invention provides an article comprising an electrical article having an uncured polymeric dielectric composition, wherein the polymeric dielectric composition comprises about 10 to about 60 wt % epoxy resin, about 20 to about 90 wt % dielectric filler, and about 0.1 to about 10 wt % diaminodiphenylsulfone curing agent.

A second embodiment of the present invention provides an article comprising an electrical article having a conductive substrate adjacent a dielectric layer, the dielectric layer comprising a cured epoxy resin composition, wherein the cured composition comprises the reaction product of epoxy resin and a diaminodiphenylsulfone curing agent.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
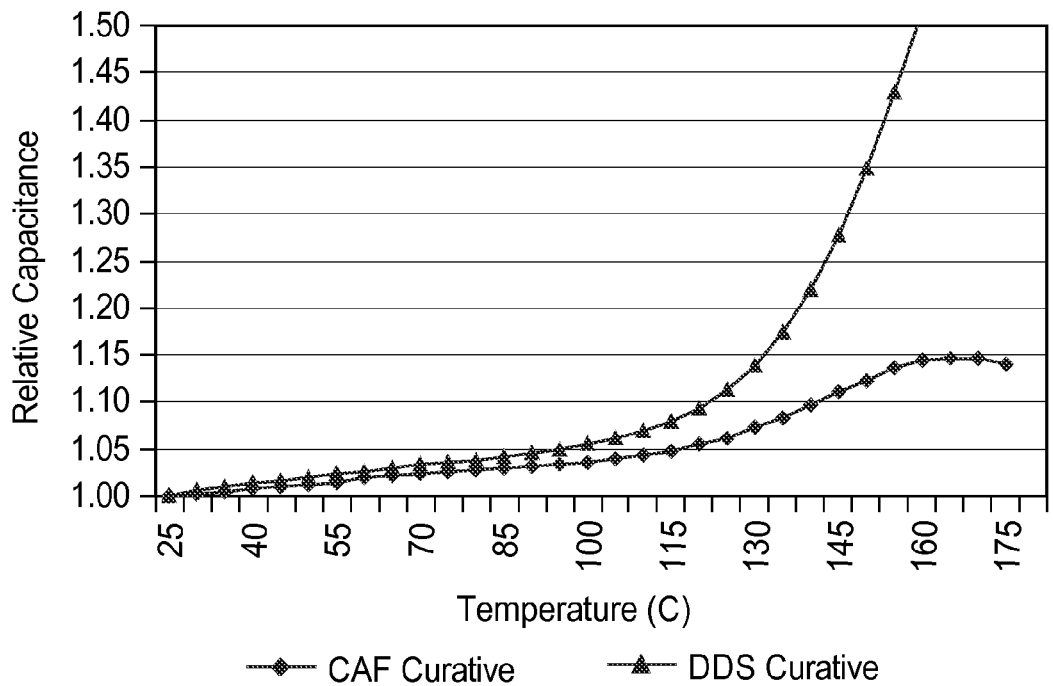
FIG. 1 compares the temperature dependence of capacitance using a DDS cured epoxy resin formulation and a CAF cured epoxy resin formulation.

In one aspect, the invention is a dielectric layer that may be used in an electrical article, such as a capacitor, a resistor, an inductor, or combinations thereof. Suitable electrical articles are described in WO 00/45624 and WO07/002,100, which are incorporated herein by reference. The electrical articles described in WO 00/45624 generally include a first self-supporting substrate having two opposing major surfaces and a second self-supporting substrate having two opposing major surfaces. A dielectric layer between the first and second substrate provides an electrical insulating function and adheres the two substrates together. The electrical articles described in WO07/002,100 may include one or more additional layers to form resistive and/or inductive element.

The dielectric layer of the electrical article, which may be made of one or more layers, is made of a polymer. Any polymer may be used that can withstand the temperatures encountered in a typical solder reflow operation, for example, about 200 to about 290° C. Suitable polymers for use in the dielectric layer include diglycidyl ethers of polyhydric phenols, allyated polyphenylene ether, acrylates, benzocyclobutene, bismaleimide triazine, cyanate ester, polyimide, polyamide, polyester, polyphenylene oxide, polytetrafluoroethylene, epoxy resins, such as epoxy novolac resins and blends and combinations of the foregoing. Epoxy resins and blends thereof are preferred.

Epoxy resin compositions used to make the dielectric layer in the electrical article of the invention include at least one aromatic polyepoxide and a diaminodiphenylsulfone (also referred to as "DDS" herein) curing agent, such as 4-diaminodiphenylsulfone or 3,3-diaminodiphenylsulfone, present in an amount sufficient to provide about 0.5 to about 1.5 amino groups, NH—R, per epoxy group present in the aromatic polyepoxide. Typically the DDS is present in an amount of about 0.1 wt % to 10 wt %. In this application aromatic polyepoxide means a molecule that includes more than one epoxide group, which are attached directly or indirectly to an aromatic group. The term epoxy resin composition will be used to refer to an uncured composition including an aromatic polyepoxide and a DDS curing agent that can be cured to form a cured epoxy resin.

Preferred aromatic polyepoxides include poly(glycidyl ether)s of polyhydric phenols. Suitable aromatic polyepoxides include the epoxy resins available from Hexion Chemical Company, Houston, Tex., under the trade designation EPON 1001F, EPON 1050, and EPON HPT-1050. Particularly preferred resins include blends of a diglycidylether of bisphenol A and a novolac epoxy, for example, 70 to 90% by weight EPON 1001F and 30 to 10% by weight EPON HPT-1050 based on the total weight of the resin. Typically, the epoxy resin is present in an amount of about 10 wt % to about 60 wt %.

Catalysts may be used in the epoxy resin composition such as, for example, amines and imidazoles. Suitable supplementary catalysts are described in WO 00/45624 and U.S. Pat. No. 4,684,678, and preferred catalysts include 2,4,6-tris(dimethylaminomethyl)phenol and 5-aminobenzotriazole.

The epoxy resin composition may also include conventional additives such as dispersants and solvents. Particularly suitable dispersants are polypropylene oxide-based dispersants having high molecular weights available under the trade designations SOLSPERSE 76500 and SOLSPERSE 71000 from Lubrizol, Ltd., United Kingdom. SOLSPERSE 76500 is a 50% active polymeric dispersant in n-butyl acetate containing quaternary amine and polypropylene oxide and is typically used to improve pigment dispersion and stability in liquid organic media. SOLSPERSE 71000 is a 100% active polymeric dispersant containing polyethyleneimine, polypropylene oxide, and polyethylene oxide copolymer and is typically used to improve pigment dispersion and stability in UV-cured coatings. Another suitable dispersant is a polyester-polyamine based polymer available under the trade designation SOLSPERSE 24000 from Lubrizol, Ltd., United Kingdom. Examples of suitable solvents include methyl ethyl ketone and methyl isobutyl ketone. Other additives, such as agents to change viscosity or to produce a level coating, can be used.

The epoxy resin composition also preferably includes a plurality of particles. Suitable particles are described in WO 00/45624, and include barium titanate, barium strontium titanate, titanium oxide, lead zirconium titanate, calcium copper titanate, lead magnesium titanate, lead lanthanium zirconate titanate, silicon dioxide, and mixtures thereof. The particles may be any shape and may be regularly or irregularly shaped. Exemplary shapes include spheres, platelets, cubes, needles, oblate, spheroids, pyramids, prisms, flakes, rods, plates, fibers, chips, whiskers, and mixtures thereof. A suitable particle size, e.g., diameter, may have a lower range of about 100 nm to about 0.05 nm and an upper range of about 2 micrometer ($\mu$m) to about 10 $\mu$m. Preferably, the particles have a size allowing at least two to three particles to be stacked vertically within the electrically insulating layer thickness. Preferably the particles have a high dielectric constant, for example 50 or greater. The loading of particles in the polymer is typically 20 to 90% by volume, preferably 30 to 65% by volume, more preferably 40 to 60% by volume, based on the total volume of the dielectric layer. In one preferred embodiment, the particles have a dielectric constant greater than 50 and are loaded at a volume % of at least 30.

The epoxy resin composition is typically formed by mixing the epoxy resin, the DDS curing agent, particles, and other optional ingredients. The resulting substantially uniform mixture is subsequently coated and dried to remove volatile components on a suitable substrate, then heated for a time and a temperature sufficient to remove volatile components and cure the composition. The resulting cured epoxy resin composition forms the dielectric layer of the electrical article. During cure, the aromatic polyepoxide and the DDS curing agent react to form a cured epoxy resin. A preferred embodiment of the cured epoxy resin has a $T_g$ of at least 100° C., preferably 120° C. and a decomposition temperature of at least 325° C.

The dielectric layers of the present invention typically have a thickness of about 1 $\mu$m to about 35 $\mu$m, most typically about 4 $\mu$m to about 25 $\mu$m.

The conductive substrates of the electrical article of the invention may include a single layer, or a plurality of layers arranged in a laminate structure. The substrates are typically conductive and may be metal such as copper or aluminum. A preferred substrate is copper. Exemplary copper includes copper foil available from Carl Schlenk, AG, Nurnberg, Germany. The first and second substrates may be the same or different.

A substrate in accordance with the electrical articles of the invention is preferably self-supporting. The term "self-supporting substrate" refers to a substrate having sufficient structural integrity such that the substrate is capable of being coated and handled. It is preferable that a substrate is flexible; however, rigid substrates may also be used.

When forming a capacitor, for example, the major surface of the first substrate in contact with the electrically insulating layer and the major surface of the second substrate in contact with the electrically insulating layer are electrically conductive. Surface treatment, which adds material to these major surfaces by, for example, oxidation or reaction with a coupling agent, may be used to promote adhesion. The resulting material on the major surface of the substrate itself may not necessarily be conductive, but a capacitor is formed provided the substrates themselves are conductive. Preferably, a substrate has a thickness ranging from 0.5 to 3 mils (approximately 10 to 80 $\mu$m), more preferably 0.5 to 1.5 mils (approximately 10 to 38 $\mu$m).

A generally suitable method for manufacturing an electrical article of the invention, such as a capacitor, is described in detail in WO 00/45624. The method includes providing a first substrate having two opposing major surfaces. An epoxy resin composition may then be coated onto a first major surface of the first substrate. A second substrate, having two opposing major surfaces, is laminated to the epoxy resin composition on the first major surface of the first substrate.

The resulting laminate is then heated for a time and a temperature sufficient to cure the epoxy resin composition.

Alternatively, the second substrate may also include an epoxy resin composition on its first major surface and the first and second substrates may be laminated together to connect the first major surface of each of the first and second substrate, i.e., the epoxy resin coated side of each substrate may be laminated together.

The substrate may be coated with the epoxy resin composition using any suitable method, for example, a gravure or die coater. The resin composition is then dried to remove residual solvent. The dry thickness of the coated epoxy resin composition depends on the percent solids in the composition and the coating speed and method.

Lamination is preferably carried out using two of the coated substrates described above. One of the coated substrates may go through an oven or over a heated roller before reaching the laminator. This preliminary heating step can be done on one or both of the coated substrates. To make an electrical article of the present invention, the coated substrates may be laminated, dielectric layer to dielectric layer, using a laminator with two heated nip rollers. Suitable air pressure is supplied to the laminator rolls. The roller speed can be set at any suitable value. The laminated material may then be heated for a sufficient time and temperature to cure the epoxy resin composition.

Although an electrical article of the present invention can be functional as it is fabricated, the electrical article may preferably be patterned, for example, to form discrete islands or removed regions in order to limit lateral conductivity. The patterned electrical article may be used as a circuit article itself or as a component in a circuit article, as described below. Either one or both sides of the electrical article are patterned to allow access to each major surface of the first and second substrates and to provide a through hole contact. Any suitable patterning technique known in the art may be employed. Suitable patterning techniques are described in WO 00/45624.

A surface of the first or second substrate of the electrical article that is accessible may be contacted, for example, by an electrical trace, to make electrical contact so that the first or second substrate acts as an electrode. In addition, it may be desirable to make electrical contact with the major surface of the first or second substrate in contact with the dielectric layer or to provide a through hole contact. Through hole contacts are useful when no interaction with the electrical device is desired.

An electrical article of the present invention may further comprise one or more additional layers, for example, to prepare a PWB or flexible circuit. The additional layer may be rigid or flexible. Exemplary rigid layers include fiberglass/epoxy composite commercially available from Isola Group, Chandler, Ariz., under the trade designation PCL-FR-226, ceramic, metal, or combinations thereof. Exemplary flexible layers comprise a polymer film such as polyimide or polyester, metal foils, or combinations thereof. Polyimide is commercially available from DuPont under the trade designation KAPTON and polyester is commercially available from Minnesota Mining and Manufacturing Company (3M), St. Paul, Minn., under the trade designation SCOTCHPAR. These additional layers may also contain electrically conductive traces on top of the layer or embedded within the layer. The term electrically conductive traces refers to strips or patterns of a conductive material designed to carry current. Suitable materials for electrically conductive traces include copper, aluminum, tin, solder, silver paste, gold, and combinations thereof.

Figure 2:
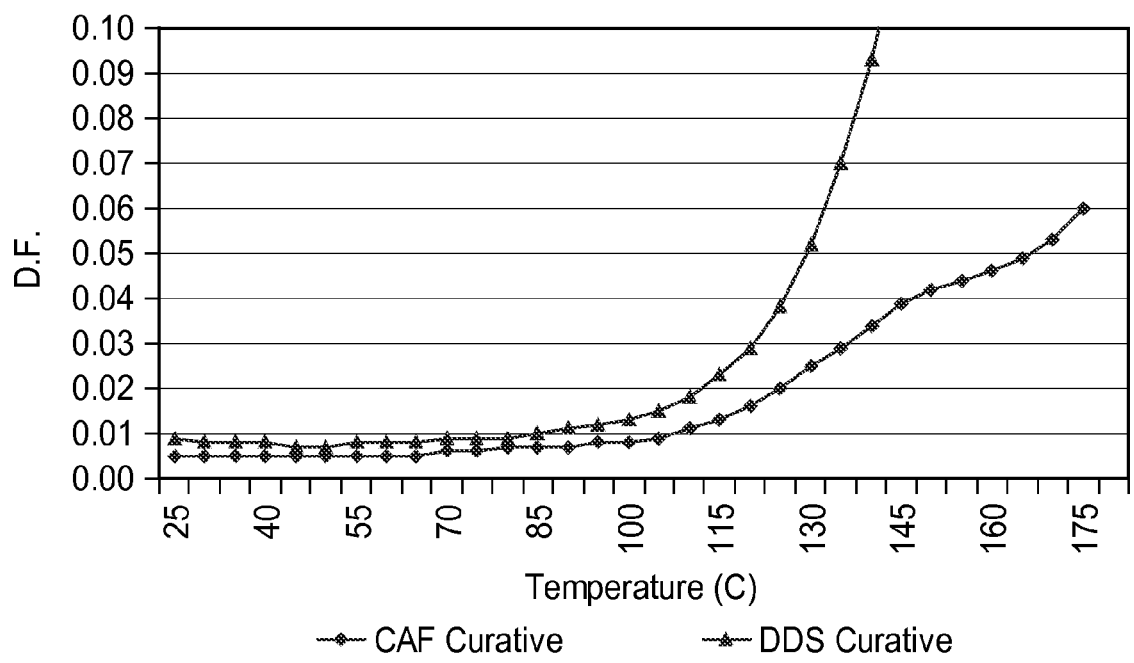
FIG. 2 compares the temperature dependence of dissipation factor for a DDS cured epoxy resin formulation and a CAF cured epoxy resin formulation.

An electrical article of the present invention can be used in a PWB, for example, a flexible circuit, as a component, which functions as a capacitor. As shown in FIGS. 1 and 2, between temperatures of about 120 to 160° C. the relative capacitance of the article increases exponentially and between temperatures of about 115 to 145° C. the dissipation factor of the article increases exponentially. While these properties make the electrical articles of the present invention less suited for applications such as high pass filters, or those requiring low attenuation, it makes them very well suited for applications such as power supply decoupling, low pass filters, low and mid-frequency band pass filters, and band stop filters because the higher capacitance density means a smaller capacitor area will be needed to meet the capacitance requirements and the higher dissipation factor will result in higher attenuation of undesired frequencies.

The electrical article may be embedded or integrated in the PWB or flexible circuit. They are suitable for use in printed circuit boards, such as modules, motherboards, and daughtercards, and integrated circuit packages. Methods for manufacturing a flexible circuit or PWB using the electrical article of the present invention are described in WO 00/45624 and are cited herein by reference.

The present invention also encompasses an electrical device comprising an electrical article of the present invention functioning in an electrical circuit of a circuit board (PWB) or a flexible circuit. The electrical device may include any electrical device which typically employs a PWB or flexible circuit having a capacitive component. Exemplary electrical devices include cell phones, telephones, fax machines, computers and servers, network switches and routers, printers, pagers, and other devices as recognized by one skilled in the art. The electrical article of the present invention is particularly useful in electrical devices in which space is at a premium or that operate at frequencies greater than 500 MHz.

This invention is illustrated by the following examples, but the particular materials and amounts thereof recited in these examples, as well as other conditions and details should not be construed to unduly limit this invention.

EXAMPLES

Materials

DDS-1 is 4,4'-diaminodiphenylsulfone (CAS-80-08-1)
DDS-2 is 3,3'-diaminodiphenylsulfone (CAS-599-61-1)
OTBAF is 9,9'-bis(3-methyl-4-aminophenyl)fluorine (CAS-15499-84-0)
CAF is 9,9'-bis(3-chloro-4-aminophenyl)fluorine (CAS-107934-68-9)
EPON 1001F is the trade designation for a bisphenol A-based epoxy resin product from Hexion Specialty Chemical, Columbus, Ohio (CAS-25036-25-3)
EPON HPT-1050 is the trade designation for a novolac epoxy resin product from Hexion Specialty Chemical, Columbus, Ohio (CAS-28064-14-4)
Barium Titanate ($BaTiO_3$), from Nippon Chemical Industrial Co., Tokyo, Japan
Methyl isobutyl ketone (MIBK) solvent, from Aldrich Chemical, Milwaukee, Wis., U.S.A.
Methyl ethyl ketone (MEK) solvent, from Aldrich Chemical, Milwaukee, Wis., U.S.A.

Example 1

A batch quantity of a 50% by weight epoxy solution was made by dissolving EPON 1001F and EPON HPT-1050 in a methyl isobutyl ketone (MIBK) solvent and methyl ethyl ketone (MEK) solvent. The EPON 1001F to EPON HPT-1050 ratio was 4:1. The MIBK to MEK ratio was 1.5:1. The epoxy resins were added to the solvents, heated to approximately 70° C. in an oven, and mixed into a substantially homogeneous solution.

A batch quantity of an 82% solids master batch solution was made by mixing barium titanate (BaTiO$_3$), a 50% solids dispersant commercially available from Lubrizol, Ltd., United Kingdom, under the trade designation SOLSPERSE 76500, MIBK, and MEK. The SOLSPERSE 76500 to barium titanate ratio was 0.024:1. The MIBK to MEK ratio was 1.36:1. The master batch solution was milled using 1.0 mm zirconia milling media and a mill, Netzsch Labstar LS1, commercially available from Netzsch-Feinmahltechnik GmbH, Selb, Germany, to break up agglomerates and filtered through a 10 μm filter and a 7 μm filter in series.

83 grams of a curative diaminodiphenylsulfone (DDS-1) commercially available from Sigma-Aldrich Chemical, St. Louis, Mo., U.S.A., was dissolved in 874 grams of MIBK and 583 grams of MEK to form a non-halogenated curing agent solution.

1021 grams of the 50% epoxy solution and 3000 grams of the filtered master batch solution were added to the non-halogenated curing agent solution and mixed into a substantially homogeneous solution, which resulted in a final dispersion solution with 55% solids.

The final dispersion was filtered through a 2.4 μm filter and die coated onto a 35 μm thick copper foil, grade 110, commercially available from Olin Corp., Waterbury, Conn., U.S.A., and dried to produce a dielectric thickness of approximately 7 μm with a barium titanate loading of approximately 80%.

Two rolls of coated copper foil were laminated together (dielectric to dielectric) using a hot roll laminator at 3 feet per minute and 275° F. to produce a final laminated product with a dielectric thickness of approximately 14 μm.

The laminated roll was converted to panels and cured in air at 190° C. for 4 hours in an oven.

Comparative Example C1

A batch quantity of a 50% by weight epoxy solution was made by dissolving EPON 1001F and EPON HPT-1050 in a methyl isobutyl ketone (MIBK) solvent and methyl ethyl ketone (MEK) solvent. The EPON 1001F to EPON HPT-1050 ratio was 4:1. The MIBK to MEK ratio was 1.5:1. The epoxy resins were added to the solvents, heated to approximately 70° C. in an oven, and mixed into a substantially homogeneous solution.

A batch quantity of an 82% solids master batch solution was made by mixing barium titanate (BaTiO$_3$), a 50% solids dispersant commercially available from Lubrizol, Ltd., United Kingdom, under the trade designation SOLSPERSE 76500, MIBK, and MEK. The SOLSPERSE 76500 to barium titanate ratio was 0.024:1. The MIBK to MEK ratio was 1.36:1. The master batch solution was milled using 1.0 mm zirconia milling media and a mill, Netzsch Labstar LS1, commercially available from NETZSCH-Feinmahltechnik GmbH, Selb, Germany, to break up agglomerates and filtered through a 10 μm filter and a 7 μm filter in series.

124 grams of a curative chloroaminophenylfluorine (CAF) was dissolved in 888 grams of MIBK and 592 grams of MEK to form a halogenated curing agent solution.

983 grams of the 50% epoxy solution and 2971 grams of the filtered master batch solution were added to the halogenated curing agent solution and mixed into a substantially homogeneous solution, which resulted in a final dispersion solution with 55% solids.

The final dispersion was filtered through a 2.4 μm filter and die coated onto a 35 μm thick copper foil, grade 110, commercially available from Olin Corp., Waterbury, Conn., U.S.A., and dried to produce a dielectric thickness of approximately 7 μm with a barium titanate loading of approximately 80%.

Two rolls of coated copper foil were laminated together (dielectric to dielectric) using a hot roll laminator at 3 feet per minute and 275° F. to produce a final laminated product with a dielectric thickness of approximately 14 μm.

The laminated roll was converted to panels and cured in air at 190° C. for 4 hours in an oven.

The Example 1 non-halogenated (DDS-1) and Comparative Example 1 halogenated (CAF) materials were tested for capacitance at 1 kHz and 23° C. and loss tangent at 1 kHz and 23° C. using an LCR meter, H.P. Model 4263B, commercially available from Hewlett-Packard Company, Palo Alto, Calif., U.S.A. The capacitance measurement for both samples was converted to the dielectric constant by using the formula C=k*Dk*A/t where C is the capacitance, k is a constant, Dk is the dielectric constant and t is the dielectric thickness. The dielectric thickness was determined by cross-sectioning and measuring at 500× magnification using an optical microscope. The leakage current at 100 volts (DC) was measured using a hipot tester, Quadtech Model 1030, commercially available from Quadtech, Maynard, Mass., U.S.A., in combination with an LCR meter, H.P. Model 4263B. The peel strength was measured using a 90 degree peel adhesion method per IPC-TM-650 2.4.8C "Peel Strength of Metallic Clad Laminates", December 1994, and a peel tester, United Model STM-10, available from United Calibration Corporation, Huntington Beach, Calif., U.S.A. The results are seen in Table 1.

TABLE 1

ELECTRICAL AND MECHANICAL MATERIAL PROPERTIES

| | Example 1 | Example C1 |
|---|---|---|
| Dielectric Constant (1 kHz) | 20.6 | 16.8 |
| Loss Tangent (1 kHz) | 0.009 | 0.006 |
| Leakage Current at 100 V (nA/in2) | <1 | <1 |
| Adhesion (pli) | 3.46 | 3.26 |

Additionally, each sample was tested for glass transition temperature ($T_g$) using a Modulated Differential Scanning calorimeter (MDSC) at reversing heat flow 4° C./min, TA Instruments Q2000, commercially available from TA Instruments, New Castle, Del., U.S.A., and decomposition temperature (Td) in nitrogen and air using a Modulated Thermogravimetric Analyzer (MTGA) at 5° C./min ramp, TA Instruments 2950, commercially available from TA Instruments, New Castle, Del., U.S.A. The results can be seen in Table 2.

TABLE 2

THERMAL PROPERTIES

| | Example 1 | Example C1 |
|---|---|---|
| Glass Transition Temperature (° C.) | 120 | 119 |
| Decomposition Temperature N2 (° C.) | 376 | 363 |
| Decomposition Temperature Air (° C.) | 374 | 338 |

The dielectric constant and loss tangent vs. temperature of both samples were measured from 25° C. to 175° C. using an LCR meter, H.P. Model 4263B, as the samples were heated from 25° C. to 175° C. in an oven. The results are shown in Table 3.

TABLE 3

ELECTRICAL PROPERTIES AT ELEVATED TEMPERATURES

|  | Example 1 | Example C1 |
|---|---|---|
| Relative Dielectric Constant/Loss Tangent (25° C.) | 1.00/0.009 | 1.00/0.005 |
| Relative Dielectric Constant/Loss Tangent (50° C.) | 1.02/0.007 | 1.01/0.005 |
| Relative Dielectric Constant/Loss Tangent (75° C.) | 1.04/0.009 | 1.03/0.006 |
| Relative Dielectric Constant/Loss Tangent (100° C.) | 1.06/0.013 | 1.04/0.008 |
| Relative Dielectric Constant/Loss Tangent (125° C.) | 1.11/0.038 | 1.06/0.020 |
| Relative Dielectric Constant/Loss Tangent (150° C.) | 1.35/0.157 | 1.12/0.042 |
| Relative Dielectric Constant/Loss Tangent (175° C.) | 1.80/0.482 | 1.14/0.060 |

Finally, both samples were tested for moisture sensitivity (popcorning) per IPC/JEDEC J-STD-020C "Moisture/Reflow Sensitivity Classification for Nonhermetic Solid State Surface Devices", July 2004. The results are shown in Table 4.

TABLE 4

MOISTURE SENSITIVITY

|  | Example 1 | Example C1 |
|---|---|---|
| Moisture Sensitivity Level 3 | Pass | Pass |
| Moisture Sensitivity Level 1 | Pass | Pass |

Examples 2-4 and Comparative Examples C2-C7

The compositions of Examples 2-4 and Comparative Examples C2-C7 are shown in Table 5 below. The examples were prepared by adding the components shown in Table 5 to a polystyrene sample vial (2 in long×0.5 in diameter, product # Z11153-8 from Sigma Aldrich, St. Louis, Mo.). The cap was applied and the samples hand shaken and tumbled for approximately 30 seconds to break up the component stratification. Following the hand mixing, a PLEXIGLAS ball pestle (⅜ in diameter, product # Z111503 from Sigma Aldrich, St. Louis, Mo.) was placed in the vial; and the sample was subjected to 60 seconds of mechanical mixing using a Crescent WIG-L-BUG (product C32010B from RINN, Elgin, Ill.). The pestle was then removed from the vial to allow more movement of the material. The mixture was hand mixed for another 30 seconds, the pestle replaced and mechanical mixing repeated for 60 seconds. The process of hand mixing and mechanical mixing was repeated a total of three times.

It was found previously that a rather intensive mixing procedure was required to ensure homogeneity of the sample. This procedure is described above and all samples in this experiment were created using it.

TABLE 5

| | | Formulation | | | |
|---|---|---|---|---|---|
| Example | Epoxy:Curative Ratio | 1001F (g) | DDS-2 (g) | OTBAF (g) | CAF (g) |
| 2 | 1:0.9 (EPON 1001F:DDS-2) | 0.8964 | 0.0933 | | |
| 3 | 1:1 (EPON 1001F:DDS-2) | 0.8968 | 0.1038 | | |
| 4 | 1:1.4 (EPON 1001F:DDS-2) | 0.8966 | 0.1457 | | |
| C2 | 1:0.9 (EPON 1001F:OTBAF) | 0.8513 | | 0.1338 | |
| C3 | 1:1 (EPON 1001F:OTBAF) | 0.8521 | | 0.1492 | |
| C4 | 1:1.4 (EPON 1001F:OTBAF) | 0.8061 | | 0.1974 | |
| C5 | 1:0.9 (EPON 1001F:CAF) | 0.8391 | | | 0.1477 |
| C6 | 1:1 (EPON 1001F:CAF) | 0.8396 | | | 0.1635 |
| C7 | 1:1.4 (EPON 1001F:CAF) | 0.7857 | | | 0.2141 |

Modulated Differential Scanning Calorimetry (MDSC)

MDSC used was Q200 1517 from TA Instruments (New Castle, Del.)

This method of differential scanning calorimetry (DSC) is unique in that is varies the temperature sinusoidally to test the specimen over a traditional temperature ramp program, resulting in separation of the heat flow signals for kinetic events (e.g. enthalpy of reaction) and temperature responsive events (e.g. $T_g$ of thermoset resins.).

TA Instruments Q200 1517 MDSC Method:
1: External event: On
2: Data storage: Off
3: Equilibrate at 25.00° C.
4: Modulate +/−0.80° C. every 60 seconds
5: Isothermal for 15.00 min
6: Data storage: On
7: Ramp 5.00° C./min to 300.00° C.
8: Isothermal for 2.00 min
9: Equilibrate at 25.00° C.
10: Isothermal for 15.00 min
11: Ramp 5.00° C./min to 300.00° C.
12: End of method Analysis of the MDSC scans consisted of evaluating the reversing heat flow signal. The sigmoidal step change in the baseline during the second ramp was clearly visible for each sample. The $T_g$ was determined using the glass transition analysis tool provided in TA Instruments Universal Analysis software to analyze this step change. A summary of the observed onset and midpoint temperatures of the glass transition is shown in Table 6 following the scans.

TABLE 6

MDSC: Epoxy Glass Transition Summary

| Example | Cure Agent | $T_{Onset}$ (° C.) | $T_g = T_{Midpoint}$ (° C.) |
|---|---|---|---|
| 2 | 1:0.9 DDS-2 | 101.1 | 107.9 |
| 3 | 1:1 DDS-2 | 111.8 | 118.4 |
| 4 | 1:1.4 DDS-2 | 122.9 | 128.4 |
| C2 | 1:0.9 OTBAF | 105.1 | 111.2 |
| C3 | 1:1 OTBAF | 110.1 | 121.7 |
| C4 | 1:1.4 OTBAF | 116.2 | 121.9 |
| C5 | 1:0.9 CAF | 106.7 | 111.3 |
| C6 | 1:1 CAF | 116.2 | 121.8 |
| C7 | 1:1.4 CAF | 124.1 | 129.4 |

It was observed that the DDS-2 and CAF curatives were able to increase the $T_g$ of the material with increasing stoichiometric ratios. The OTBAF showed no increase beyond the stoichiometric ratio of epoxy to amine functional groups.

Modulus and Hardness Measurement by Nanoindentation

This measurement process measures Elastic Modulus (E) and Hardness (H) as a continuous function of depth into the surface of the sample. Modulus and Hardness data were averaged about a spatial window of 2000 nm for a bulk assessment of hardness and modulus. The results are shown in Table 7.

All specimens were tested with a MTS Nanoindenter DCM. The samples were tested probing from the top surface of the sample. For all experiments a diamond Berkovich probe was used. Spatial drift set point was held at 0.5 nm/s maximum. Constant strain rate experiments were run at 0.05/s to a command depth of 2000 nm. The areas to be tested were located as seen top-down as viewed through a video screen with 100× magnification. The test regions are selected locally with 100× video magnification of the DCM to insure that tested regions were representative of the desired sample material, i.e. free of voids, inclusions, or debris. Furthermore, microscope optical axis-to-indenter axis alignment was checked and calibrated previous to testing by an iterative process where test indentations were made into a fused quartz standard, with error correction provided by software in the DCM. The dynamic excitation frequency and amplitude of the indenter was held constant at 75 hz and 1 nm for all experiments. Multiple tests were performed for each sample to assess reproducibility.

The sample surface was located via a surface find function where the probe approached the surface with a spring stiffness in air which changed significantly when the surface was encountered. Once the surface was encountered, load-displacement data was acquired as the probe indented the surface. This data was then transformed to Hardness and Elastic Modulus material properties based on the methodology described below. The experiment was repeated in different areas of the sample so that a statistical assessment could be made of the mechanical properties.

The Elastic Modulus was determined directly from the load-displacement data is a composite Modulus, i.e. the Modulus of the indenter-to-sample mechanical system. The composite Modulus for these load-displacement indentation experiments can be determined from:

$$S = 2\beta \sqrt{\frac{1}{\pi A}} F$$

where
S—contact stiffness, determined via the Continuous-Stiffness-Method (CSM), by solving the differential equation relating a periodic forcing function $$f(t, \varpi) = kx + b\frac{dx}{dt} + m\frac{dx2}{dt2}$$

to the coefficients of sample-indenter mechanical system, i.e. the in-phase and out-of-phase components of the displacement response to the forcing function, yield the in-phase spring constant k, (thus the stiffness—hence contact area), and out of phase damping coefficient, b. The default excitation frequency for these tests is 75 hz.

A—area of contact [m^2], assuming that the indentation replicates the shape of the indenter during indentation, the indenter geometry is modeled via analytic geometry so that the projected area, A=h^2+higher order terms where h—displacement depth, and higher order terms are empirically measured.
F—Composite Modulus [Gpa]
β=1.04, Berkovich geometry Then the sample material's Elastic Modulus (E) is obtained from $$1/F = (1-u^2)/K + (1-v^2)/E$$

where
u—Poisson Ratio of diamond indenter=0.07
K—Elastic Modulus of diamond indenter =1141 Gpa
v—Poisson Ratio of sample (an assumption must be made here—~0.35 for these samples)

Hardness is defined as the threshold contact stress, expressed in giga or mega Pascals, for the onset of plastic flow of the specimen. It is expressed as $$H = P/A$$

where
H—Hardness [Gpa]
P—Load necessary for plastic flow
A—plastic contact area

TABLE 7

Elastic Modulus and Hardness Results of Nanoindentation Experiment

| | Indentation Depth: | 2000 nm | |
|---|---|---|---|
| Example | Curavtive Ratio (Epoxy:Amine) | E (GPa) | H (MPa) |
| 2 | 1:0.9 | 3.245 | 236.3 |
| 3 | 1:1 | 3.264 | 217.1 |
| 4 | 1:1.4 | 2.998 | 196.2 |
| C2 | 1:0.9 | 2.93 | 211.6 |
| C3 | 1:1 | 3.262 | 221.1 |
| C4 | 1:1.4 | 3.144 | 236.5 |
| C5 | 1:0.9 | 3.109 | 215.4 |
| C6 | 1:1 | 1.665 | 166.1 |
| C7 | 1:1.4 | 1.398 | 136 |

Assuming the measurements from the 2000 nm depth is representative of the "bulk" material, increasing the amine/epoxy ratio for both the DDS-2 and CAF curatives resulted in a decreased hardness of the sample. The CAF curative showed the greatest decrease in hardness, decreasing 36% between the 0.9 and 1.4 amine/epoxy ratios. Alternatively the OTBAF resulted in an 11% increase in hardness over the 0.9 to 1.4 ratio.

Various modifications and alterations of this invention will become apparent to those skilled in the art without departing from the scope and spirit of this invention and it should be understood that this invention is not to be unduly limited to the illustrative embodiments set forth herein.

What is claimed is:

1. An article comprising:
an electrical article having an uncured polymeric dielectric composition, wherein the polymeric dielectric composition comprises about 10 to about 60 wt % epoxy resin, 20 to 90 wt % dielectric filler, and about 0.1 to about 10 wt % diaminodiphenylsulfone curing agent, and further wherein the article has, upon curing, a relative capacitance at 1 kHz that increases exponentially over the entire range from 120 to 160° C.

2. The article of claim 1, wherein the polymeric dielectric composition comprises the dielectric filler at a loading of no more than 60% by volume, and wherein the dielectric filler comprises dielectric particles with a dielectric constant of at least 50.

3. The article of claim 2, wherein the dielectric particles are barium titanate, barium strontium titanate, titanium oxide, lead zirconium titanate, calcium copper titanate, lead magnesium titanate, lead lanthanum zirconate titanate, silicon dioxide, or mixtures thereof.

4. The article of claim 3, wherein the dielectric particles are barium titanate having a maximum particle size of 10 μm or less.

5. The article of claim 1, upon curing, having a dielectric constant greater than about 10 and a loss tangent of at least about 0.0009 at 1 kHz.

6. The article of claim 1, upon curing, having a glass transition temperature of at least 120° C. and a decomposition temperature of about 325° C. or greater.

7. The article of claim 1 having, upon curing, a dissipation factor at 1 kHz that increases exponentially over the entire range from 115 to 145° C.

8. The article of claim 1 wherein the epoxy resin is selected from the group consisting of diglycidyl ethers of polyhydric phenols, epoxy novolac resins, and combinations thereof.

9. An article comprising:
   an electrical article having a conductive substrate adjacent a dielectric layer, the dielectric layer comprising a cured epoxy resin composition, wherein the cured composition comprises the reaction product of epoxy resin and a diaminodiphenylsulfone curing agent, and further wherein the article has a relative capacitance at 1 kHz that increases exponentially over the entire range from 120 to 160° C.

10. The article of claim 9, wherein the dielectric layer further comprises dielectric particles at a loading of no more than 60% by volume.

11. The article of claim 10, wherein the dielectric particles are barium titanate having a maximum particle size of 10 μm or less.

12. The article of claim 9 having, upon curing, a dielectric constant greater than about 10 and a loss tangent of at least about 0.0009 at 1 kHz.

13. The article of claim 9 having, upon curing, a glass transition temperature of at least 100° C. and a decomposition temperature of at least about 325° C.

14. The article of claim 9 having a dissipation factor at 1 kHz that increases exponentially over the entire range from 115 to 145° C.

15. The article of claim 9 wherein the epoxy resin is selected from the group consisting of diglycidyl ethers of polyhydric phenols, epoxy novolac resins, and combinations thereof.

16. The article of claim 9, wherein the conductive substrate comprises copper.

17. The article of claim 9 wherein the electrical article is selected from the group consisting of capacitors, resistors, inductors, or combinations thereof.

18. The article of claim 9 wherein the electrical article is an embedded capacitor suitable for use in a printed circuit boards and integrated circuit packages.

19. The article of claim 18 wherein the embedded capacitor functions as one or more of a power supply decoupling capacitor, a low pass filter, a band pass filter, and a band stop filter.

20. The article of claim 9, wherein the electrical article is configured to operate at frequencies greater than 500 MHz.

\* \* \* \* \*